(12) United States Patent
Shin et al.

(10) Patent No.: US 6,180,457 B1
(45) Date of Patent: Jan. 30, 2001

(54) METHOD OF MANUFACTURING NON-VOLATILE MEMORY DEVICE

(75) Inventors: Wang-chul Shin, Yongin; Jeong-eui Kang; Kyong-moo Mang, both of Seoul, all of (KR)

(73) Assignee: Samsung Electronics Co., Ltd., Suwon (KR)

(*) Notice: Under 35 U.S.C. 154(b), the term of this patent shall be extended for 0 days.

(21) Appl. No.: 09/405,534

(22) Filed: Sep. 24, 1999

(30) Foreign Application Priority Data

Sep. 25, 1998 (KR) .................................................. 98-39956

(51) Int. Cl.[7] .................................................. H01L 21/336
(52) U.S. Cl. .......................... 438/258; 438/257; 438/263; 438/265; 438/266; 438/527; 438/560; 438/593; 438/595
(58) Field of Search ..................................... 438/257, 258, 438/263, 264, 265, 266, 267, 231, 593, 594, 595, 261, 262, 527, 560

(56) References Cited

U.S. PATENT DOCUMENTS 5,635,416 * 6/1997 Chen et al. ........................... 438/258
5,792,696 * 8/1998 Kim et al. ............................ 438/258

OTHER PUBLICATIONS

*IEEE Journal of Solid–State Circuits*, vol.30, No. 11, pp. 1149–1155 (Nov. 1995).*

* cited by examiner

*Primary Examiner*—Charles Bowers
*Assistant Examiner*—Hsien Ming Lee
(74) *Attorney, Agent, or Firm*—Cantor Colburn LLP

(57) ABSTRACT

A method of manufacturing a non-volatile memory device is provided. According to an aspect of this method, an isolation layer is formed on a semiconductor substrate including a cell array part and a peripheral circuit part. A floating gate pattern is formed exposing the semiconductor substrate in the peripheral circuit part with a tunnel oxide layer interposed between the floating gate pattern and the semiconductor substrate in the cell array part, and an interlayer insulating layer covering the floating gate pattern is formed. A control gate layer is formed, which covers the interlayer insulating layer and the semiconductor substrate in the peripheral circuit part while interposing a gate oxide layer between the control gate layer and the semiconductor substrate. The isolation layer in the peripheral circuit part is protected by leaving a part of the control gate layer covering the peripheral circuit part, and a control gate, an interlayer insulating layer pattern, and a floating gate in the cell array part are formed by sequentially patterning the control gate layer, the interlayer insulating layer, and the floating gate pattern in the cell array part. A first low-concentration impurity layer is formed by first ion-implantation of arsenic into the semiconductor substrate adjacent to the floating gate using the control gate and the control gate layer covering the peripheral circuit part as an ion-implantation mask. A gate is formed in the peripheral circuit part by patterning the control gate layer in the peripheral circuit part with a photo resist pattern shielding the cell array part. A second low-concentration impurity layer is formed by second ion-implantation of second impurities, phosphorous, into the semiconductor substrate adjacent to the gate using the photo resist pattern as an ion-implantation mask.

11 Claims, 12 Drawing Sheets

METHOD OF MANUFACTURING NON-VOLATILE MEMORY DEVICE

BACKGROUND OF THE INVENTION

1. Field of the Invention

The present invention relates to a semiconductor memory device, and more particularly, to a method of manufacturing a non-volatile memory device in which electrical isolation characteristics are improved.

2. Description of the Related Art

A non-volatile memory device, which is a type of a semiconductor device, continuously stores memorized content even when supply of power is stopped. Generally, a memory cell of a non-volatile memory device includes a gate electrode comprised of a floating gate and a control gate and a drain or source region adjacent to the gate electrode.

An electrically erasable and programmable read only memory (EEPROM) device is included within the group of non-volatile memory devices, and a NAND type EEPROM device configured so that a plurality of transistors can be connected in series to one bit line is typical. Such a NAND-type EEPROM device is favorable for high integration.

A conventional method of manufacturing a non-volatile memory device will now be described by taking the NAND-type non-volatile memory device as an example.

Figure 1:
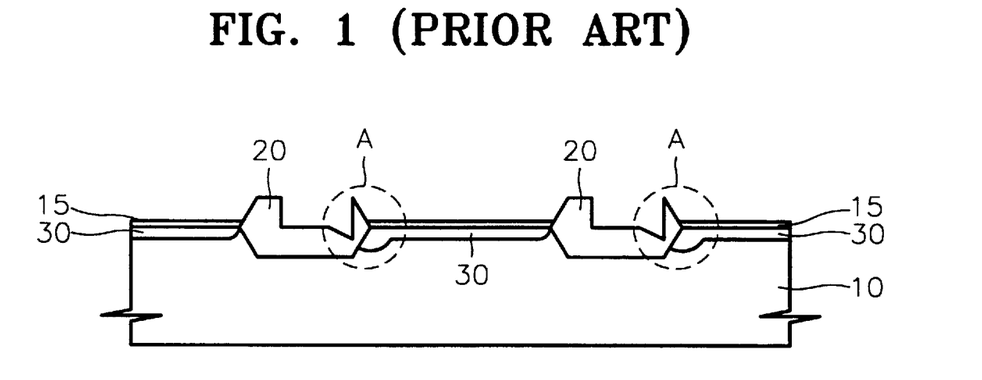
FIG. 1 is a schematic cross-sectional view for illustrating a conventional method of manufacturing a non-volatile memory device.

FIG. 1 is a cross-sectional view of an isolation region after forming a control gate of a conventional non-volatile memory device.

To be more specific, an isolation layer 20 for defining an active region is formed on a semiconductor substrate 10. A tunnel oxide 15 and a floating gate pattern is formed on the semiconductor substrate 10. An interlayer insulating layer covering the floating gate pattern is formed, and a control gate layer is then formed. The control gate layer, the interlayer insulating layer, and the floating gate pattern are patterned by a self alignment method to form a gate structure. Impurities, e.g., phosphorous (P), are implanted into the active region of the semiconductor substrate 10 exposed adjacent to the floating gate, to thus form a drain or source region 30.

The isolation layer 20 adjacent to the gate structure in this process may be damaged by the self alignment method.

To be more specific, the unpatterned interlayer insulating layer covers one sidewall of the floating gate pattern, and the control gate layer extends over and covers the isolation layer 20. Accordingly, over etch to a depth as much as the thickness of the floating gate pattern or more must be performed in the self alignment patterning process to expose the side wall of the floating gate pattern by removing the part of the interlayer insulating layer covering the sidewall of the floating gate pattern. This is because the part of the interlayer insulating layer covering the sidewall of the floating gate pattern has a thickness in the vertical direction that is equal to or greater than the thickness of the floating gate pattern.

However, only the interlayer insulating layer and the control gate layer cover a part of the isolation layer 20 adjacent to the floating gate pattern. Hence, the isolation layer 20 can be etched out to about the height of the floating gate layer or higher by this excessive etching.

This undesired etching of the isolation layer 20 becomes excessive with the high integration of a non-volatile memory device, and hence, may cause several problems. To be more specific, the high integration of the non-volatile memory device requires a reduction in the size of a cell, and thus, further a reduction in the size of the isolation layer 20 which is formed between active regions. The reduction in the size of the isolation layer 20 requires a reduction in the size of a bird's beak, etc. to secure the width of an active region. To do this, the isolation layer 20 should become remarkably thinner.

Furthermore, the high integration of the non-volatile memory device requires a reduction in design rule. Thus, the floating gate, etc. overlaps the edge of the isolation layer 20 by only a very short length. The relatively thin edge of the isolation layer 20, e.g., a bird's beak portion, can be exposed by the floating gate, etc. The isolation layer 20 remaining after over-etched becomes significantly thinner.

The reduction in the thickness of the isolation layer 20 due to the above-described self alignment patterning process prevents a process margin from being obtained in the subsequent process. For example, in an ion implantation process where the isolation layer 20 is used as an implanting mask, when the isolation layer 20 becomes thinner as described above, in particular, when its edge becomes thinner, the thickness of the isolation layer 20 may not be maintained to or over the distance which ions penetrate. Hence, impurities implanted in the ion implantation process can penetrate below the isolation layer 20.

Such a penetration of impurities below the isolation layer 20 can cause channeling of impurities below the isolation layer 20. Such a channeling phenomenon can have a degrading effect on the operation characteristics of the non-volatile memory device by lowering the concentration of a channel stop layer formed below the isolation layer 20.

Also, the reduction in the thickness of the edge of the isolation layer 20 can generate an effect of reducing the electrical isolation distance between the drain or source regions 30 as shown by A in FIG. 1. That is, the drain or source region 30 is extended to thus probably degrade the characteristics of isolation.

SUMMARY OF THE INVENTION

To solve the above problems, it is an object of the present invention to provide a method of manufacturing a non-volatile memory device, by which an isolation layer can be prevented from becoming thinner, and the electrical characteristics of the isolation layer can be prevented from being degraded in an ion implantation process due to a reduction in the thickness of the isolation layer.

According to an aspect of the present invention to achieve the above object, an isolation layer is formed on a semiconductor substrate including a cell array part and a peripheral circuit part. A floating gate pattern is formed exposing the semiconductor substrate in the peripheral circuit part with a tunnel oxide layer interposed between the floating gate pattern and the semiconductor substrate in the cell array part, and an interlayer insulating layer covering the floating gate pattern is formed. A control gate layer is formed, which covers the interlayer insulating layer and the semiconductor substrate in the peripheral circuit part while interposing a gate oxide layer between the control gate layer and the semiconductor substrate. A mask layer is further formed on the control gate layer, after forming the control gate layer. The mask layer is used as an ion-implantation mask in a subsequent first or third ion-implantation step.

The isolation layer in the peripheral circuit part is protected by leaving a part of the control gate layer covering the peripheral circuit part, and a control gate, an interlayer insulating layer pattern, and a floating gate in the cell array part are formed by sequentially patterning the control gate layer, the interlayer insulating layer, and the floating gate pattern in the cell array part. A first low-concentration impurity layer is formed by first ion-implantation of impurities into the semiconductor substrate adjacent to the floating gate using the control gate and the control gate layer covering the peripheral circuit part as an ion-implantation mask. Preferably, the mask layer covering the control gate layer is used as an ion implantation mask. Arsenic is used as the first impurity, and the arsenic is ion-implanted at an energy of about 30 KeV to 60 KeV in the first ion-implantation step. It is preferable that the arsenic is ion-implanted at an energy of about 30 KeV to 45 KeV in the first ion-implantation step.

A gate is formed in the peripheral circuit part by patterning the control gate layer in the peripheral circuit part with a photo resist pattern shielding the cell array part. Here, the cell array part is covered by the photoresist pattern such that impurity can be prevented from being injected upon ion implantation into the peripheral circuit part. A second low-concentration impurity layer is formed by second ion-implantation of second impurities into the semiconductor substrate adjacent to the gate using the photo resist pattern as an ion-implantation mask. Preferably, the mask layer covering the gate is used as an ion-implantation mask. Phosphorous is used as the second impurity, and the phosphorous is ion-implanted at an energy of about 30 KeV to 70 KeV in the second ion-implantation step. Preferably, the phosphorous is ion-implanted at an energy of about 30 KeV to 45 KeV in the second ion-implantation step.

The first or second impurity layer has a concentration of approximately $5 \times 10^{12}$ to $5 \times 10^{13}$ dose number/cm$^2$. Preferably, the first or second impurity layer has a concentration of approximately $1 \times 10^{13}$ to $2 \times 10^{13}$ dose number/cm$^2$, and thus acts as a low-concentration impurity layer having a lightly doped drain (LDD) structure.

A spacer exposing the semiconductor substrate is formed by covering the side walls of the floating gate and the control gate in the cell array part and covering the sidewall of the gate in the peripheral circuit part. A third high-concentration impurity layer overlapping the first and second impurity layers is formed by third ion-implantation of third impurities into the exposed semiconductor substrate using the spacer as an ion-implantation mask. Here, arsenic is used as the third impurity, and the arsenic is ion-implanted at an energy of about 30 KeV to 60 KeV in the third ion-implantation step. Preferably, the arsenic is ion-implanted at an energy of about 30 KeV to 45 KeV in the third ion-implantation step. The third impurity layer formed in this way acts as a high-concentration impurity layer having an LDD structure.

According to the present invention, impurity permeation into the lower portion of an isolation layer in an ion implantation process due to a reduction in the thickness of the isolation layer can be prevented. Accordingly, channeling is prevented, so that the operational characteristics of a non-volatile memory device can be improved.

BRIEF DESCRIPTION OF THE DRAWINGS

The above objective and advantages of the present invention will become more apparent by describing in detail a preferred embodiment thereof with reference to the attached drawings in which.

DESCRIPTION OF THE PREFERRED EMBODIMENT

Hereinafter, embodiments of the present invention will be described in detail with reference to the attached drawings. However, the embodiments of the present invention can be modified into various other forms, and the scope of the present invention must not be interpreted as being restricted to the described embodiments. The embodiments are provided to more completely explain the present invention to those skilled in the art. In drawings, the thicknesses of layers or regions are exaggerated for clarity. Like reference numerals in the drawings denote the same members. Also, when it is written that a layer is formed "on" another layer or a substrate, the layer can be formed directly on the other layer or the substrate, or other layers can intervene therebetween.

A non-volatile memory device according to the present invention is formed by performing a special ion implantation process using individual impurities on each of a peripheral circuit portion and a cell array portion. Hence, isolation characteristics depending on a reduction in the thickness of an isolation layer can be prevented from being degraded. An embodiment of a method of manufacturing a non-volatile memory device according to the present invention will now be described in detail with reference to the attached drawings by taking a NAND-type non-volatile memory device as an example. However, the present invention must not be interpreted as being restricted to this embodiment.

Figure 2:
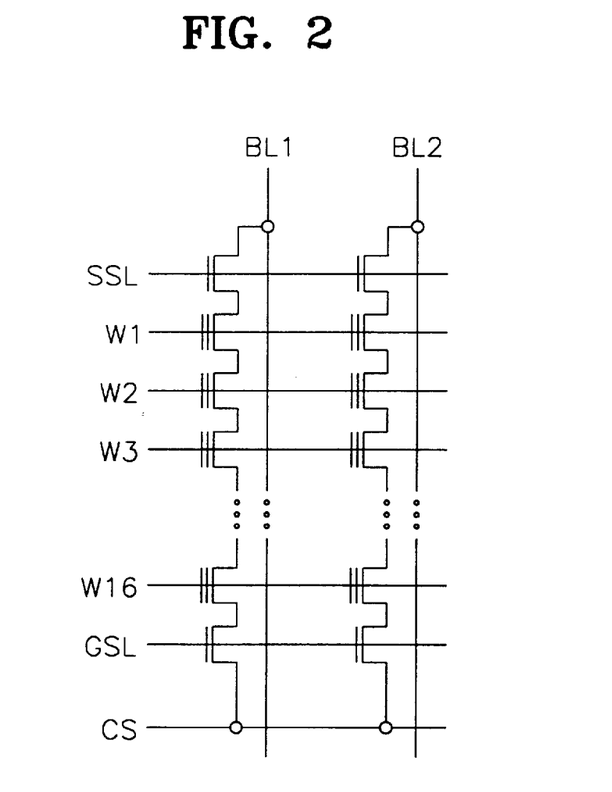
FIG. 2 is a schematic circuit diagram of a non-volatile memory device according to the present invention.
Figure 3:
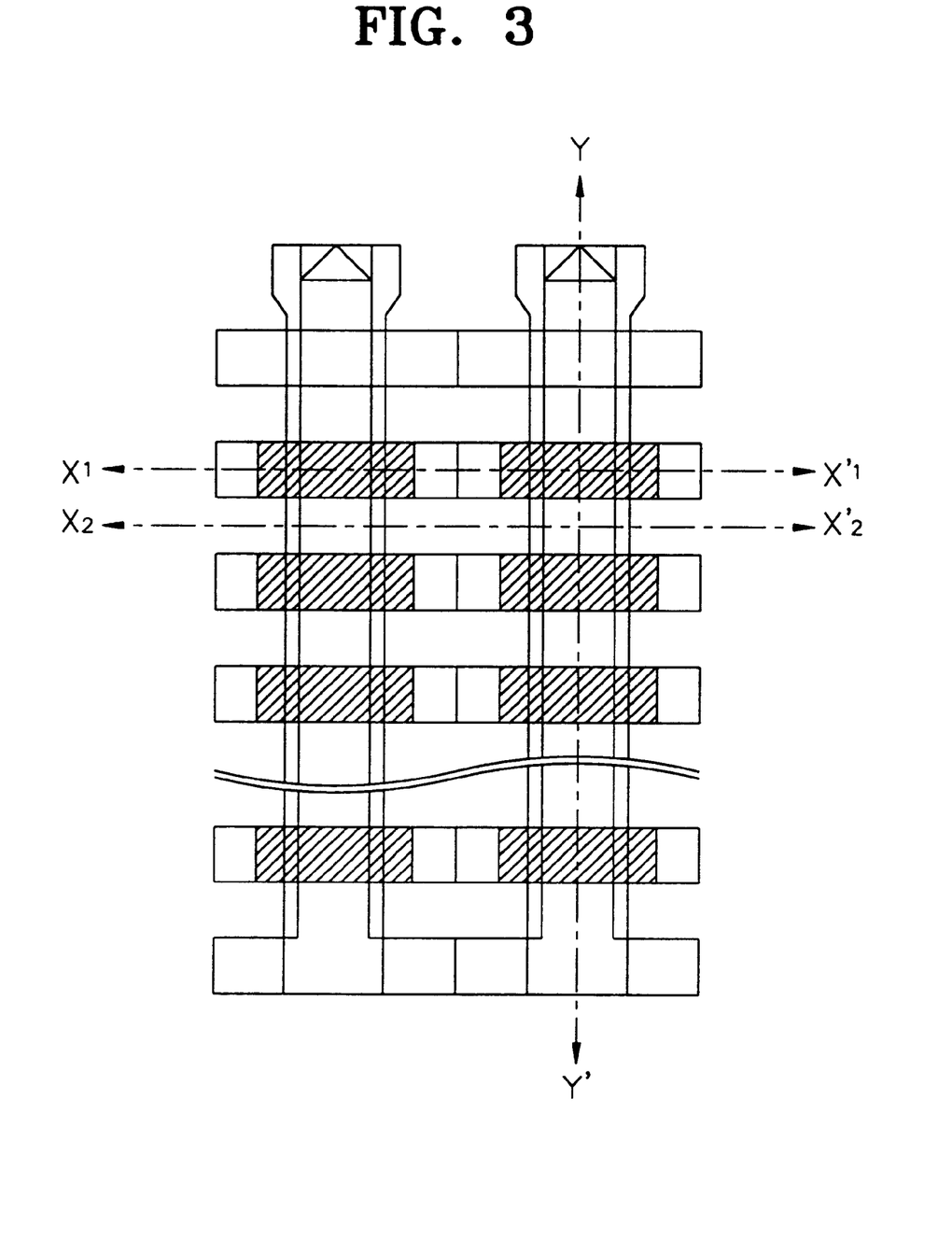
FIG. 3 is a lay out diagram for explaining the non-volatile memory device of FIG. 2.

FIG. 2 is a circuit diagram of a non-volatile memory device according to the present invention, and FIG. 3 is a lay out diagram according to FIG. 2.

To be more specific, FIGS. 2 and 3 are respectively a circuit diagram and a lay out diagram of a NAND-type non-volatile memory device taken as an example. A region on which a memory cell is to be formed and an isolation region are divided by an active region. A plurality of word lines W1 through W16 and selection lines SSL and GSL are formed perpendicularly to the active region. Each of the word lines is configured so that each cell can have a floating gate. Each active region is formed so as to be electrically connected between a bit line and a string select line (SSL) via a contact, in order to operate bit lines BL1 and BL2, etc. which perpendicularly intersect the word lines.

Figure 16:
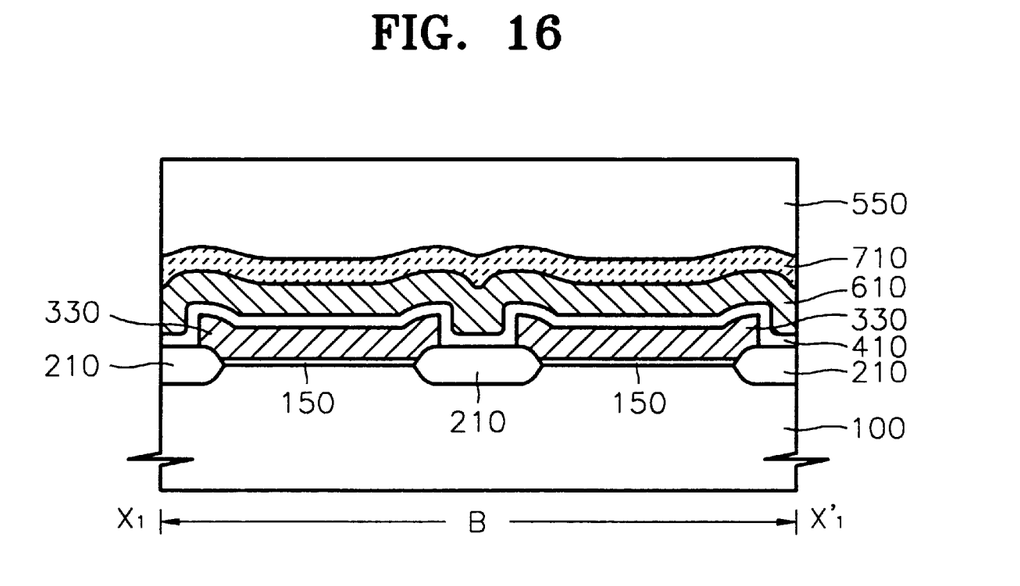
FIGS. 16, 17, 18 and 19 are schematic cross-sectional views illustrating patterning of a control gate in a process for manufacturing a non-volatile memory device according to the present invention.
Figure 17:
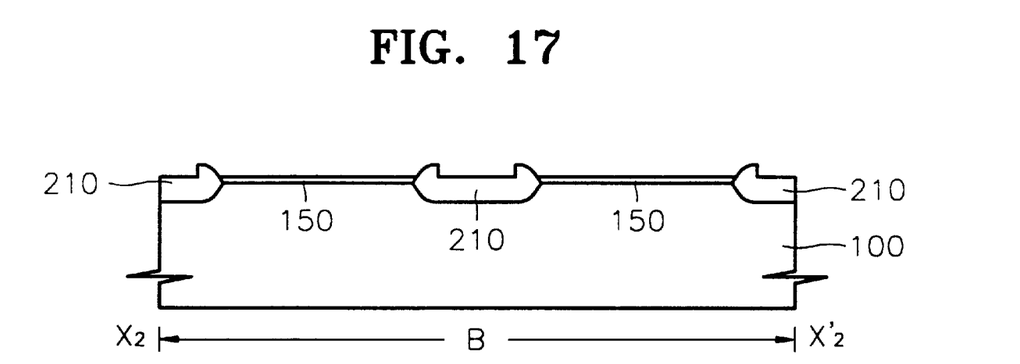
Figure 21:
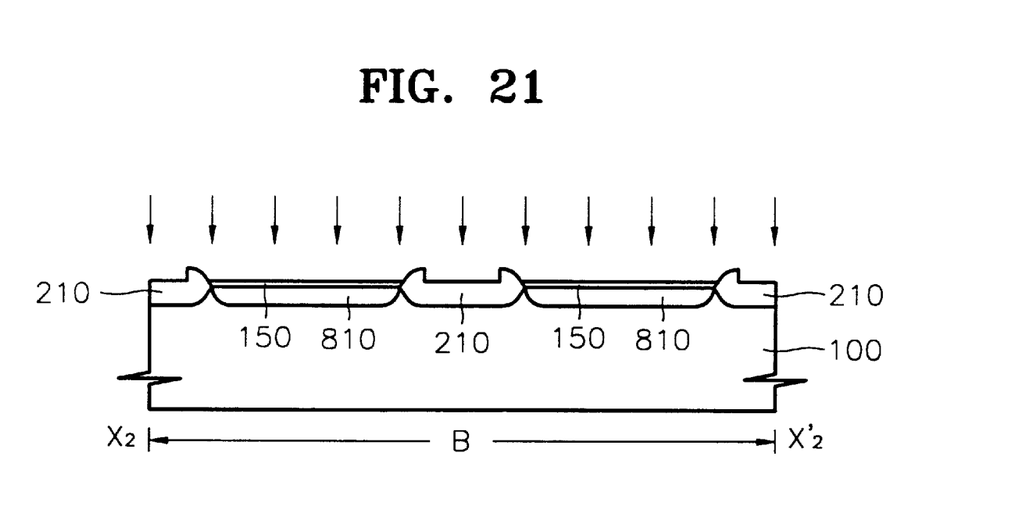
Figure 22:
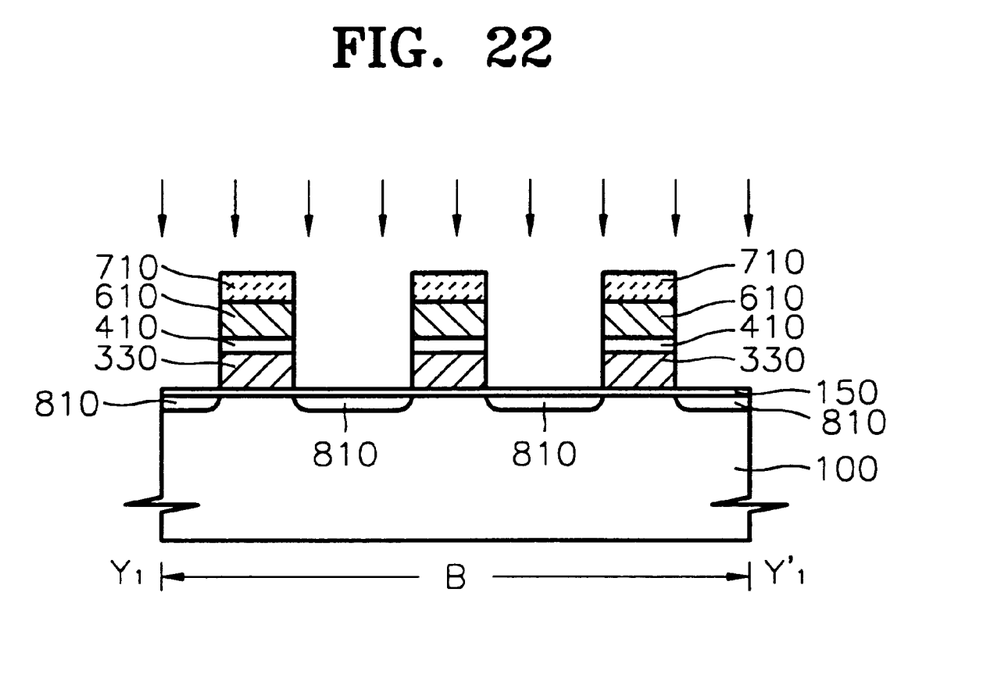
Figure 23:
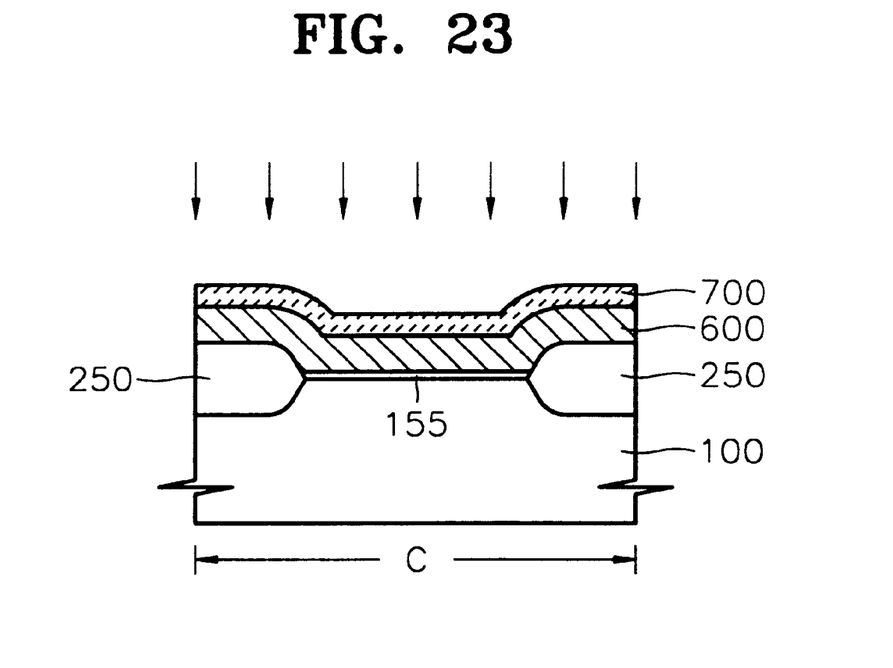

A method of manufacturing a non-volatile memory device according to the present invention will now be described referring to FIGS. 4 through 27. FIGS. 4, 7, 10, 13, 16, and 20 are cross-sectional views of a cell array unit taken along line $X_1$–$X'_1$ of FIG. 3 for each process step. FIGS. 17 and 21 are cross-sectional views of a cell array unit taken along line $X_2$–$X'_2$ of FIG. 3 for each process step. FIGS. 5, 8, 11, 14, 18, 22, 24 and 26 are cross-sectional views of a cell array unit taken along line Y-Y' of FIG. 3 for each process step. FIGS. 6, 9, 12, 15, 19, 23, 25 and 27 are cross-sectional views of a peripheral circuit unit.

Figure 4:
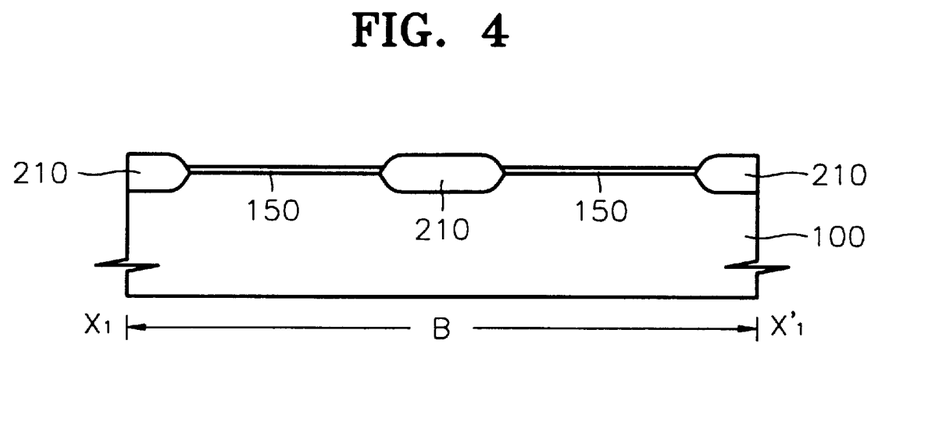
FIGS. 4, 5, and 6 are schematic cross-sectional views illustrating formation of an isolation layer on a semiconductor substrate in a process for manufacturing a non-volatile memory device according to the present invention.
Figure 5:
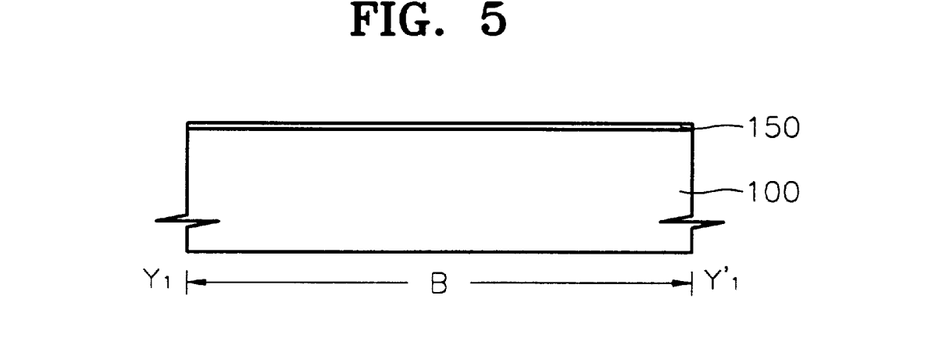
Figure 6:
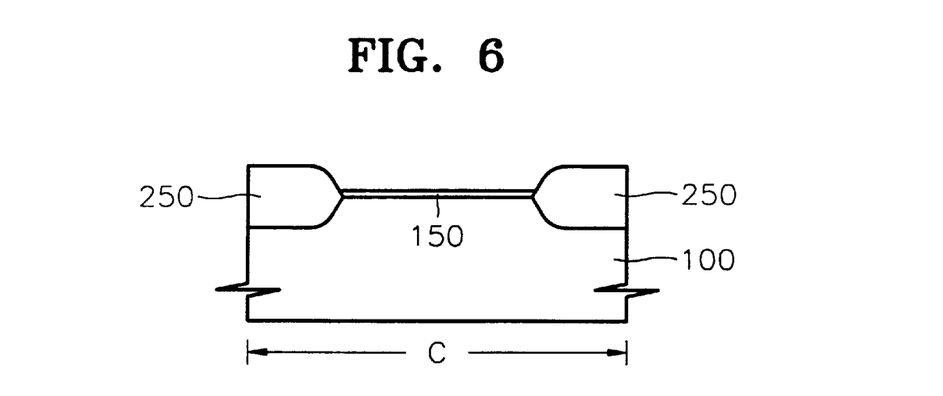

FIGS. 4, 5 and 6 show the step of forming an isolation layer 210 or 250 on a semiconductor substrate 100.

To be more specific, isolation layers 210 and 250 for defining active regions are formed on the semiconductor substrate 100 formed of a cell array unit B shown in FIGS. 4 and 5 and a peripheral circuit unit C shown in FIG. 6. A silicon substrate doped with first conductive type, e.g., P-type impurities, can be used as the semiconductor substrate 100. The semiconductor substrate 100 is doped with second conductive type, e.g., N-type or P-type impurities by ion implantation or ion diffusion, and thus, a well or the like may be formed in the semiconductor substrate 100.

The isolation layers 210 and 250 are formed on the above-described pre-processed semiconductor substrate 100 by an isolation generating method such as a selective silicon oxidation method. In order to improve the isolation characteristics or field threshold voltage ($V_{th}$) of the isolation layers 210 and 250, channel stop ion implantation can be performed before or after the isolation layer 210 or 250 is formed. Here, the same type of impurities as the impurities doping the well or pocket p-well, e.g., boron, will be implanted in the above-described channel stop ion implantation.

The thickness of each of the isolation layers 210 and 250 varies with the integration level of a semiconductor device, but they are formed to have a thickness of about 4000 Å. However, the growth of the isolation layer 210 on the cell array unit B is restricted by a limit to a critical line width. That is, the design rule of a pitch of about 0.7 $\mu$m or less is applied to the cell array unit B, and the isolation layer 210 is thus substantially restricted to a thickness of about 3000 Å. On the other hand, a larger critical line width is secured in the peripheral circuit unit (C) than the cell array unit (B), so that the isolation layer 250 grows to a thickness of about 4000 Å.

The thicknesses of the thus-grown isolation layers 210 and 250 are consumed through the pre-process such as a sacrificial oxide layer forming and removing process or a tunnel oxide layer 150 forming process. As shown in FIG. 4, the isolation layer 210 is reduced to a thickness of about 2000 Å in the cell array unit (B). Here, the ends of the isolation layer 210, i.e., the portions on which a bird's beak is generated, have a width of about 0.1 $\mu$m, and the center of the isolation layer 210, whose thickness is maintained to about 2000 Å, is about 0.25 $\mu$m in width. On the other hand, the thickness of the isolation layer 250 in the peripheral circuit unit (C) as shown in FIG. 6 is reduced to about 3000 Å.

After the isolation layers 210 and 250 are formed as described above, a tunnel oxide layer 150 or the like is grown on the exposed semiconductor substrate 100, i.e., the semiconductor substrate of the active regions, using a thermal oxidation process. Here, the tunnel oxide layer 150 or the like is thinly formed to a thickness of about 90 Å or less.

Figure 7:
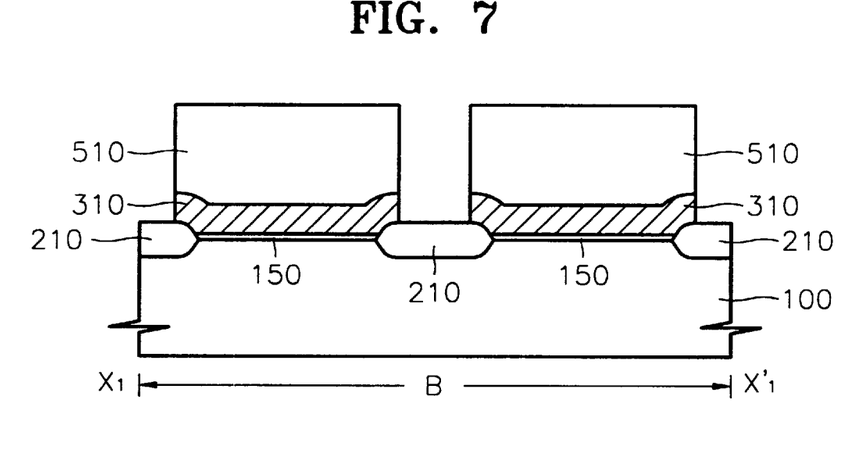
FIGS. 7, 8, and 9 are schematic cross-sectional views illustrating formation of a floating gate pattern on a tunnel oxide layer in a process for manufacturing a non-volatile memory device according to the present invention.
Figure 8:
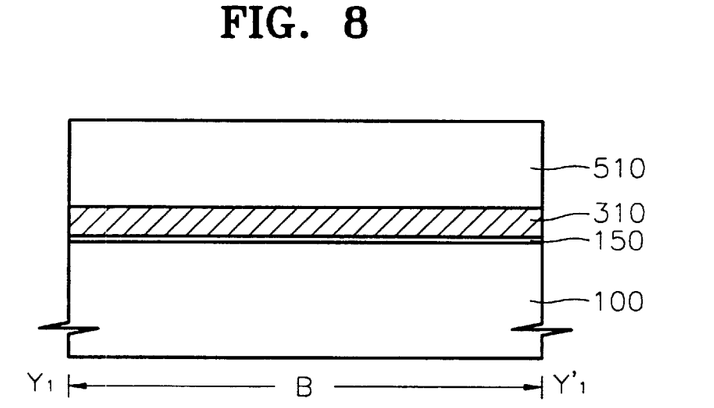
Figure 9:
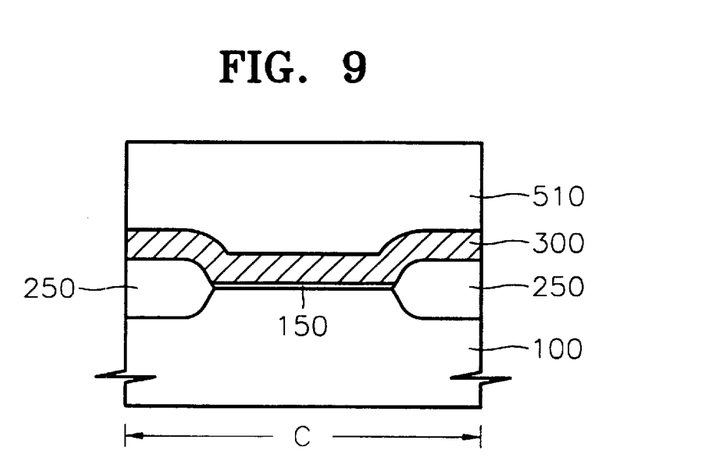

FIGS. 7, 8, and 9 schematically illustrate forming a floating gate pattern 300 on the tunnel oxide layer 150.

To be more specific, a floating gate layer 300 is formed of a conductive material on the semiconductor substrate 100. For example, a conductive polycrystalline silicon layer or the like is formed to a thickness of about 1000 Å on the entire surface of the semiconductor substrate 100, and acts as the floating gate layer 300.

Only a part of the floating gate layer 300, which is placed in the cell array unit (B) of the semiconductor substrate 100, is patterned by photolithography. That is, a first photo resist pattern 510 is formed covering the peripheral circuit unit (C) as shown in FIG. 9 and exposing a part of the floating gate layer 300 in the cell array unit (B) as shown in FIGS. 7 and 8. Here, the first photo resist pattern 510 exposes a part of the floating gate layer 300, e.g., a part covering the isolation layer 210, in the Y-Y' direction of FIG. 3. Thus, the cross-sectional view of FIG. 3 in the $X_2$–$X'_2$ direction is also the same as FIG. 7.

The floating gate layer 300 is etched using the first photo resist pattern 510 as an etch mask, thus forming the floating gate pattern 310 in the cell array unit (B). At this time, a part of the floating gate layer 300 is not patterned and remains in the peripheral circuit unit (C).

The floating gate layer is formed of a conductive polycrystalline silicon layer or the like. Since the polycrystalline silicon layer has an excellent etch selection ratio with respect to an oxide layer, the isolation layer 210 is rarely consumed in the process for patterning the floating gate layer 300. Thus, the isolation layer 210 can be maintained at a thickness of about 2000 Å.

Figure 10:
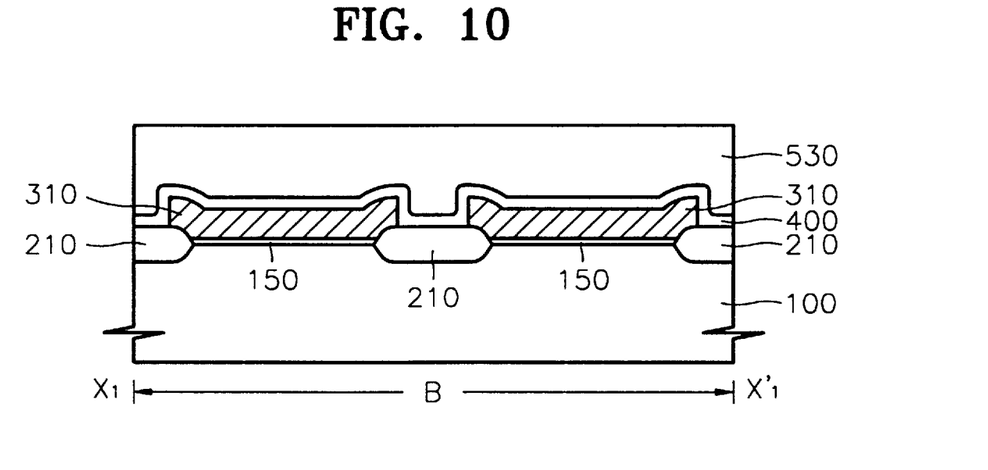
FIGS. 10, 11, and 12 are schematic cross-sectional views illustrating formation of an interlayer insulating layer covering a floating gate pattern in a process for manufacturing a non-volatile memory device according to the present invention.
Figure 11:
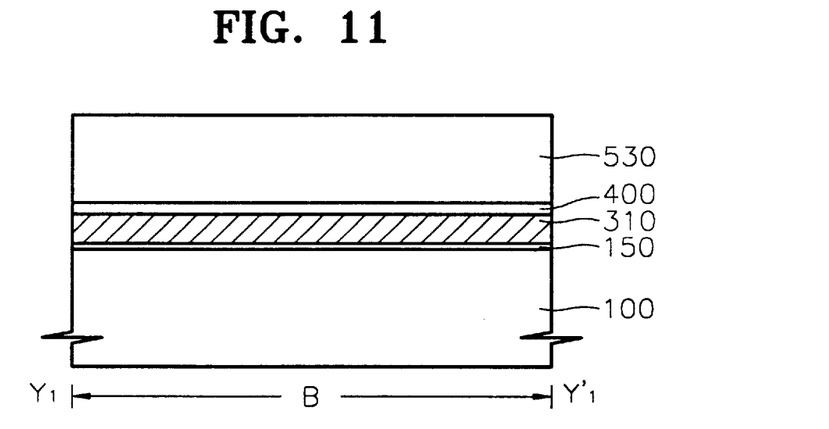
Figure 12:
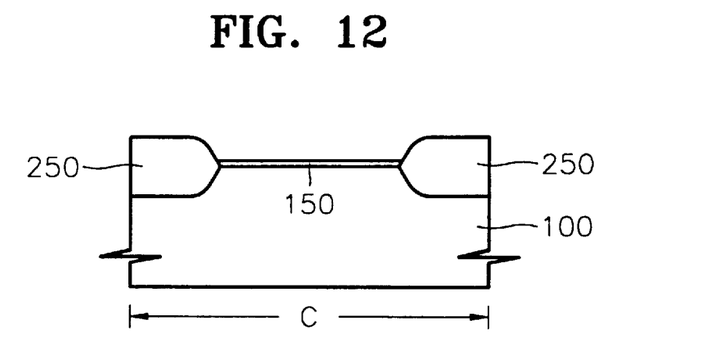

FIGS. 10, 11, and 12 schematically illustrate formation of an interlayer insulating layer 400 covering the floating gate pattern 310.

To be more specific, an insulative material is deposited on the entire surface of the semiconductor substrate 100 in the cell array unit (B) and the peripheral circuit unit (C) so as to cover the floating gate pattern 310 and the floating gate layer 300, and the deposited insulative material is used as the interlayer insulating layer 400. For example, an oxide silicon layer, a nitride silicon layer, or a complex layer of oxide and nitride silicon layers is deposited. Preferably, an oxide/nitride/oxide (ONO) layer is formed to a thickness of about 2000 Å and acts as the interlayer insulating layer 400.

As shown in FIG. 12, a part of the floating gate layer 300 and a part of an interlayer insulating layer 400 in the peripheral circuit unit (C) are removed. That is, a second photo resist pattern 530 covering and shielding the cell array unit (B) as shown in FIGS. 10 and 11 and exposing the peripheral circuit unit (C) is formed. The part of interlayer insulating layer 400 and the floating gate layer 300 in the exposed peripheral circuit unit (C) are etched out using the second photo resist pattern 530 as an etch mask.

Figure 13:
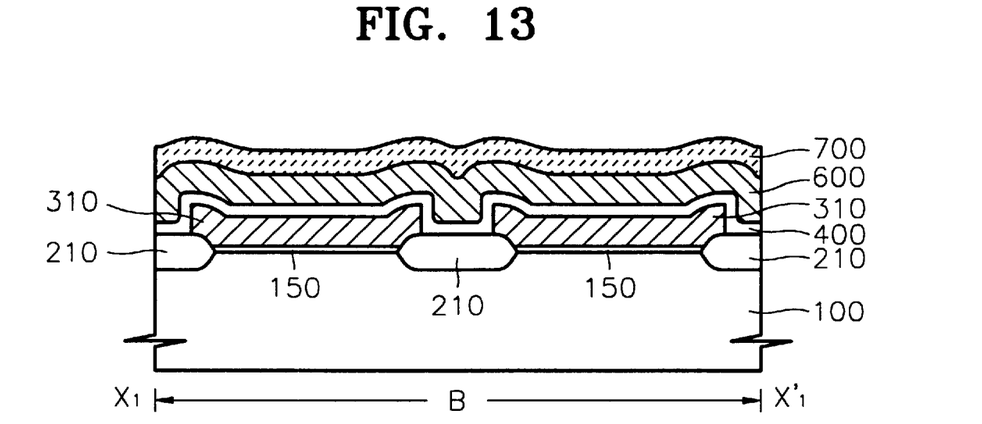
FIGS. 13, 14, and 15 are schematic cross-sectional views illustrating formation of a control gate layer covering a cell array portion and a peripheral circuit portion in a process for manufacturing a non-volatile memory device according to the present invention.
Figure 14:
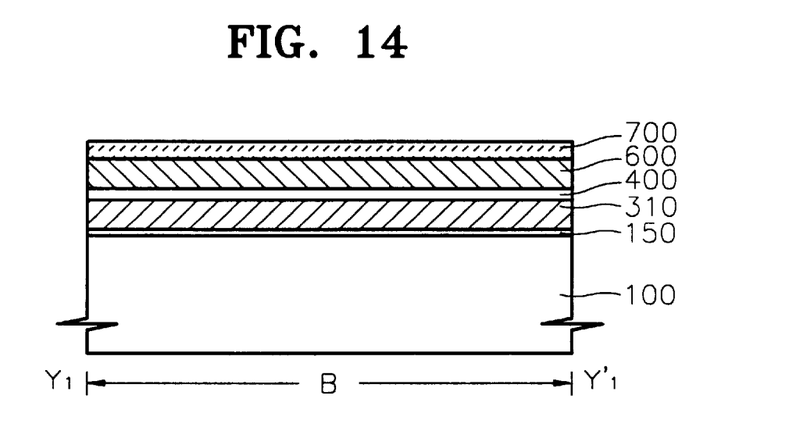
Figure 15:
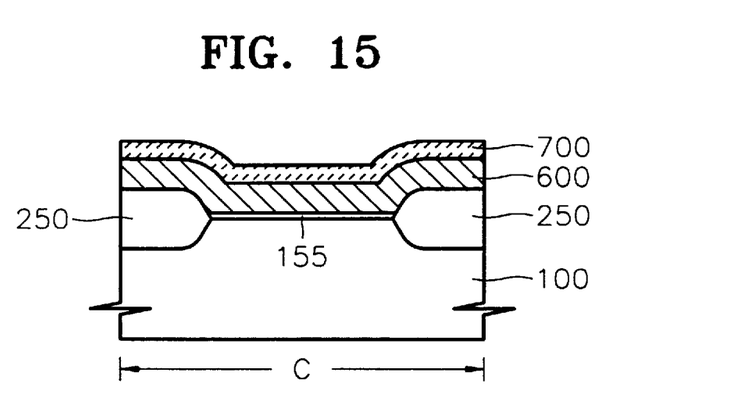

FIGS. 13, 14, and 15 schematically illustrate formation of a control gate layer 600 covering the semiconductor substrate 100 in the cell array portion (B) and the peripheral circuit portion (C).

To be more specific, the surface of the semiconductor substrate 100 is exposed by removing the tunnel oxide layer 150 after the process for removing the interlayer insulating layer 400 and the floating gate layer 300 from the peripheral circuit unit (C). A thermal oxidation process is again performed on the exposed semiconductor substrate 100 to form a gate oxide layer 155 required by the peripheral circuit unit (C).

A control gate layer 600 covering the interlayer insulating layer 400 in the cell array unit (B) is formed as shown in FIGS. 13 and 14. The control gate layer 600 is also formed on the semiconductor substrate 100 of the peripheral circuit unit (C) as shown in FIG. 15.

For example, a first conductive layer such as a conductive polycrystalline, e.g., an impurity-doped polycrystalline silicon layer is formed. Here, the first conductive layer is formed to a thickness of about 1000 Å. A second conductive layer is formed of a conductive material having a low resistance, such as a tungsten silicide ($WSi_2$) layer, on the first conductive layer. The second conductive layer is formed to a thickness of about 1000 Å. The thus-formed double layer is used as the control gate layer 600.

A mask layer 700 to be used as an etch mask or an ion implantation mask in a subsequent etch process or ion implantation process can be further formed on the control gate layer 600. Preferably, the mask layer 700 is used as the ion implantation mask in the subsequent ion implantation process. For example, an oxide layer having a thickness of about 3000 Å formed by chemical vapor deposition is used as the mask layer 700.

As described above, the control gate layer 600 and the mask layer 700 are formed over the entire surface of the semiconductor substrate 100, so that the cross-section in the $X_2$–$X'_2$ direction of FIG. 3 is also the same as FIG. 13.

FIGS. 16, 17, 18 and 19 schematically illustrate patterning a control gate 610.

Figure 18:
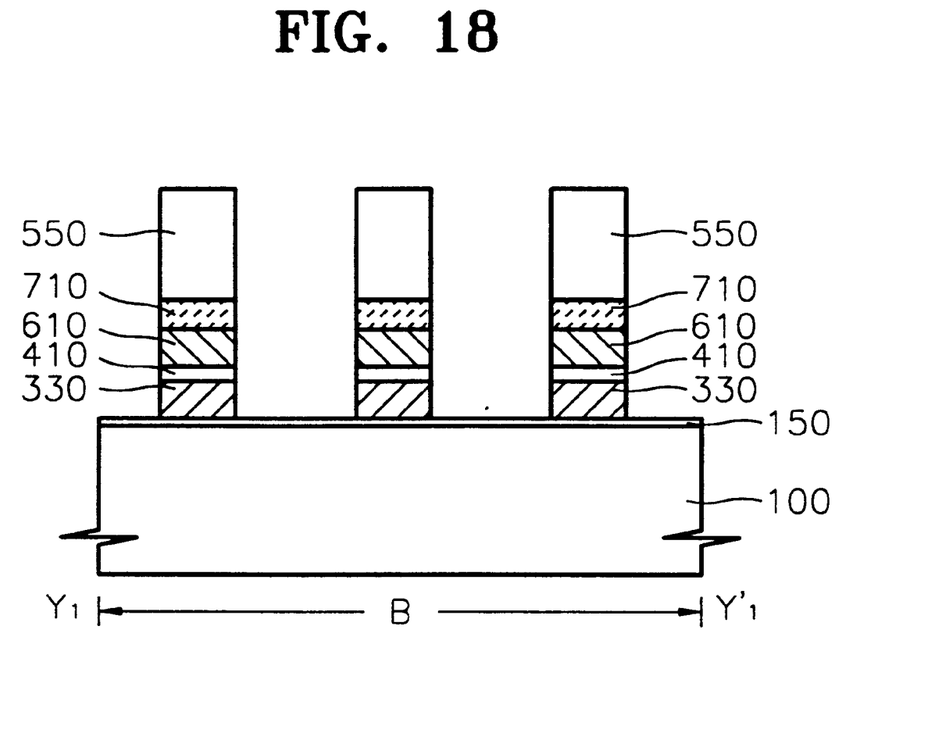
Figure 19:
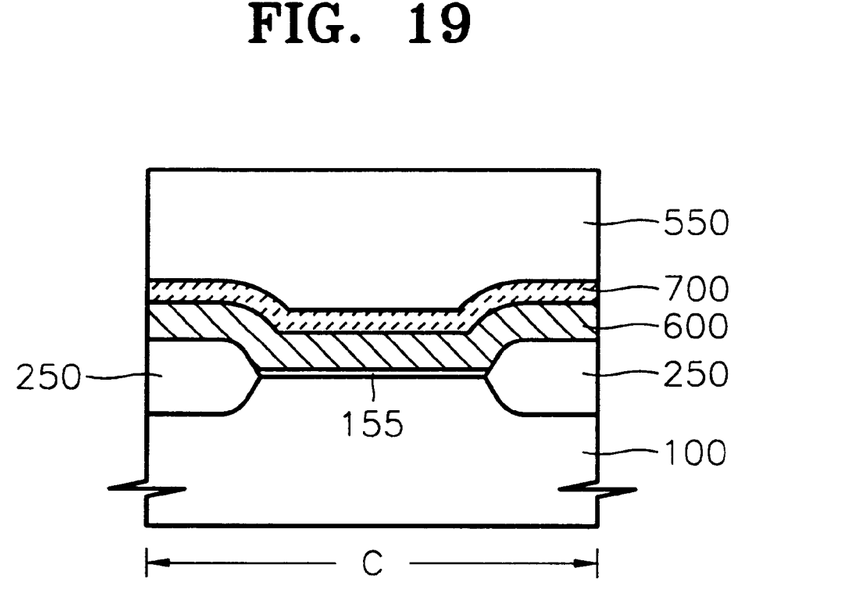
Figure 20:
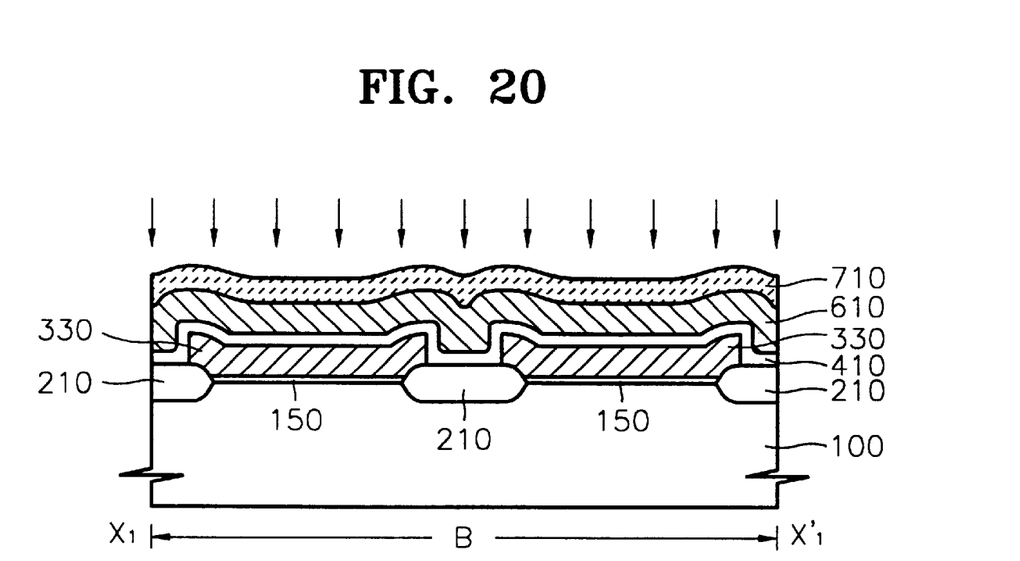
FIGS. 20, 21, 22 and 23 are schematic cross-sectional views illustrating formation of a first impurity layer on a semiconductor substrate exposed by a floating gate in a process for manufacturing a non-volatile memory device according to the present invention.

To be more specific, a third photo resist pattern 550 covering the control gate layer 600 or/and the mask layer 700 in the peripheral circuit unit (C) is formed. The third photo resist pattern 550 also exposes part of the control gate layer 600 or mask layer 700 in the cell array unit (B). As shown in FIG. 19, the third photo resist pattern 550 is also formed to shield the control gate layer 600 or the mask layer 700 in the peripheral circuit unit (C).

The exposed mask layer 700 or exposed control gate layer 600 is etched using the third photo resist pattern 550 as an etch mask. Thus, a first mask pattern 710 or a control gate 610 is formed as shown in FIGS. 16, 17, and 18. That is, the first mask pattern 710 and the control gate 610 exposing part of the semiconductor substrate 100 of the active region are formed in the $X_2$–$X'_2$ direction.

After the control gate 610 is formed, the exposed interlayer insulating layer 400 and the exposed floating gate pattern 310 are sequentially etched by a self alignment etching method. Thus, a floating gate 330 and an interlayer insulating layer pattern 410 to be self-aligned with the control gate 610 are formed as shown in FIGS. 16 and 18.

Meanwhile, the formation of the interlayer insulating layer pattern 410 by a self alignment method as described above allows a part of the isolation layer 210 adjacent to the active region in the cell array unit (B) to be patterned as shown in FIG. 17.

To be more specific, the control gate layer 600 and the interlayer insulating layer 400 cover the isolation layer 210 in the cell array unit (B) exposed without being overlapped with the floating gate pattern 310 as shown in FIG. 13. Thus, the interlayer insulating layer 400 has a step difference as much as the height of the floating gate pattern 310, and the sidewall of the floating gate pattern 310 is covered by the interlayer insulating layer 400. Thus, the part of the interlayer insulating layer 400 covering the side wall of the floating gate pattern 310 has a vertical thickness that is equal to or greater than the height of the floating gate pattern 310.

A portion to expose the semiconductor substrate 100 described above, i.e., the side wall of the floating gate pattern 310 adjacent to the active region, must be exposed. Thus, an etching process for removing a part of the interlayer insulating layer 400 covering the side wall of the floating gate pattern 310 is required. For this, the above-described self alignment patterning process requires an over-etching method by which a part of the interlayer insulating layer 400 can be removed.

This over-etching allows the isolation layer 210 to be also patterned by the step difference of the interlayer insulating layer 400 as shown in FIG. 17. That is, the isolation layer 210 is also etched by the step difference of the interlayer insulating layer 400 that is as much as the height of the floating gate pattern 310.

Hence, a part of the isolation layer 210 adjacent to the active region, having a thickness of about 2000 Å as described above, can be reduced to a thickness of about 1000 Å by an etching process in which patterning is made in a self alignment manner. That is, as shown in FIG. 17, the isolation layer 210 is patterned, and thus, the thickness thereof can be significantly reduced.

FIGS. 20, 21, 22 and 23 schematically illustrate formation of a first impurity layer 810 on the semiconductor substrate 100 exposed by the floating gate 330.

To be more specific, when the peripheral circuit unit (C) is shielded by the mask layer 700 or/and the control gate layer 600, the first impurity layer 810 is formed by first ion implantation of first impurities such as arsenic (As) into the exposed semiconductor substrate 100 in the cell array unit (B). Preferably, the first impurity layer 810 is formed by a first ion implantation method using the first mask pattern 710 formed by patterning the mask layer 700 as an ion implantation mask. Here, the first impurity layer 810 can accomplish a low-concentration impurity layer having a lightly doped drain (LDD) structure.

Arsenic is implanted into the semiconductor substrate 100 under the energy conditions of about 30 KeV to 60 KeV, preferably, about 30 KeV to 45 KeV. Here, arsenic of about $5 \times 10^{12}$ to $5 \times 10^{13}$ dose number/$cm^2$ or about $1 \times 10^{13}$ to $2 \times 10^{13}$ dose number/$cm^2$ is ion-implanted.

For example, when the arsenic is ion-implanted at an energy of about 40 KeV, the ion penetration range ($R_p$) is about 217 Å, and the ion penetration range standard deviation ($\Delta R_p$) is about 27 Å. Thus, the penetration depth of implanted arsenic ions is given as approximately $R_p + 3\Delta R_p$, i.e., about 433 Å.

Meanwhile, when phosphorous (P) impurities are implanted at an energy of 40 KeV in a general ion implantation process such as that used for forming the above-described drain or source region, $R_p$ of about 388 Å and $\Delta R_p$ of about 152 Å are shown. Thus, the penetration depth of the phosphorous ions is about 844 Å.

When phosphorous is used as an impurity in the first ion implantation process described above, the phosphorous ions can penetrate into the area below the isolation layer 210 of FIG. 17 whose thickness has been significantly reduced.

That is, as described above, the isolation layer 210 of FIG. 17 can be reduced to a thickness of about 1000 Å, so that the process margin of ion implantation is reduced.

In particular, portions adjacent to the active area, i.e., bird's beak portion, of the isolation layer 210 of FIG. 17 are thinner than the initial thickness or center of the isolation layer 210. Thus, when the floating gate pattern 310 extends over the end of the isolation layer by misalignment, the thickness of the portions of the isolation layer 210 adjacent to the active area can be significantly reduced by the over etching as described above. For example, the thickness of the end portion can be greatly reduced to less than about 1000 Å as shown in FIG. 1. Thus, the ion-implanted phosphorous can penetrate into below the isolation layer. That is, phosphorous ions or the like penetrate into the semiconductor substrate 100 below the isolation layer, so that the concentration of the channel stop layer below the isolation layer can be changed. Also, the drain or source region 30 can be enlarged as shown by A of FIG. 1. That is, the isolation distance between the drain and source regions can be reduced.

The generation of such a defect degrades the isolation characteristics. The degradation of the isolation characteristics affects the operation of the non-volatile memory device, e.g., programming, erasing, and reading. These operations will now be described.

In the erasing operation for providing a negative $V_{th}$ of a cell, about 0V is applied to all word lines of a selected block, e.g., to the control gate 610. Next, about 21V is applied to the semiconductor substrate 100 to induce a voltage difference of about 21V between the semiconductor substrate 100 and the control gate 610. Hence, electrons in the floating gate 330 are injected into the semiconductor substrate 100 by Fowler-Nordheim tunneling (hereinafter, called F-N tunneling) to thus provide a $V_{th}$ of about –3V.

The programming operation is to provide a positive $V_{th}$ by selectively implanting electrons into the floating gate 330. For this, 0V is applied to the semiconductor substrate 100, a selected bit line, and a ground selection line (GSL) to cause the F-N tunneling. About 18V to 20V is applied to a selected word line, about 10V is applied to non-selected word lines, and $V_{CC}$ is applied to a source selection line (SSL). Here, in the selected bit line, the voltage of a channel region is maintained at 0V by $V_{CC}$ applied to the SSL.

Accordingly, due to the difference between the voltage of the channel and the voltage of about 18V to 20V applied to the selected word line, electrons of the semiconductor substrate 100 are injected into the floating gate 330 by F-N funneling. Thereby, the cell $V_{th}$ has a positive (+) value.

Here, the $V_{th}$ of the cells connected to an unselected word line must not be changed. Thus, a pass voltage of about 10V or the like is applied to non-selective word lines. In particular, for a bit line which must not be programmed, $V_{CC}$ rather than 0V is applied to the bit line, the channel voltage of a word line to which a program voltage has been applied must be raised to about 8V, and occurrence of F-N tunneling is prevented. Therefore, the cells are not programmed.

Alternatively, about 8V and about 10V are applied to the non-selected bit line and the SSL, respectively, to directly transmit 8V applied to the non-selected bit line to the channel of a non-selected cell. Also, in this case, the voltage difference between the floating gate 330 and the channel cannot substantially cause F-N tunneling, and hence, the initial $V_{th}$ value is maintained.

As a consequence, in the programming operation, generation of program errors can be prevented by constantly maintaining a channel voltage with respect to a non-selected cell, i.e., a cell of a word line which is not programmed even when a program voltage is applied thereto, for example, to about 8V. In the case of a channel voltage lower than 8V, the difference between the lower channel voltage and a program voltage applied to a selected word line causes F-N tunneling, so that the $V_{th}$ of a non-selected cell is changed.

Thus, the channel voltage of the selected bit line must be maintained to about 0V, and the channel voltage of non-selected bit lines must be constantly maintained to about 8V, during programming. The maintenance of the channel voltage is greatly affected by the isolation characteristics. For example, when impurity ions are implanted below the isolation layer, they have an effect of reducing the concentration of the channel stop layer. Such an effect degrades the isolation characteristics. Thus, the $V_{th}$ of non-selected cells may be changed during programming.

However, in an embodiment of the present invention, as described above, the first impurity layer 810 is formed under the condition that ions are implanted to a shallow depth. That is, arsenic capable of penetrating to an ion penetration depth of about 433 Å is ion-implanted as an impurity at an energy of about 40 KeV. In this way, an ion implantation process margin with respect to an isolation layer having a thickness of about 400 Å or more can be obtained in comparison with the case of ion-implanting phosphorous as an impurity under the same conditions as those described above.

Thus, even when the thickness of the isolation layer is reduced as described above, ions can be prevented from penetrating into an area below the isolation layer. That is, even when the thickness of the isolation layer is about 1000 Å or less, the arsenic does not penetrate into an area below the isolation layer. As described above, the ion implantation process margin with respect to the thickness of the isolation layer can be increased by using arsenic as the impurity for ion implantation.

Figure 24:
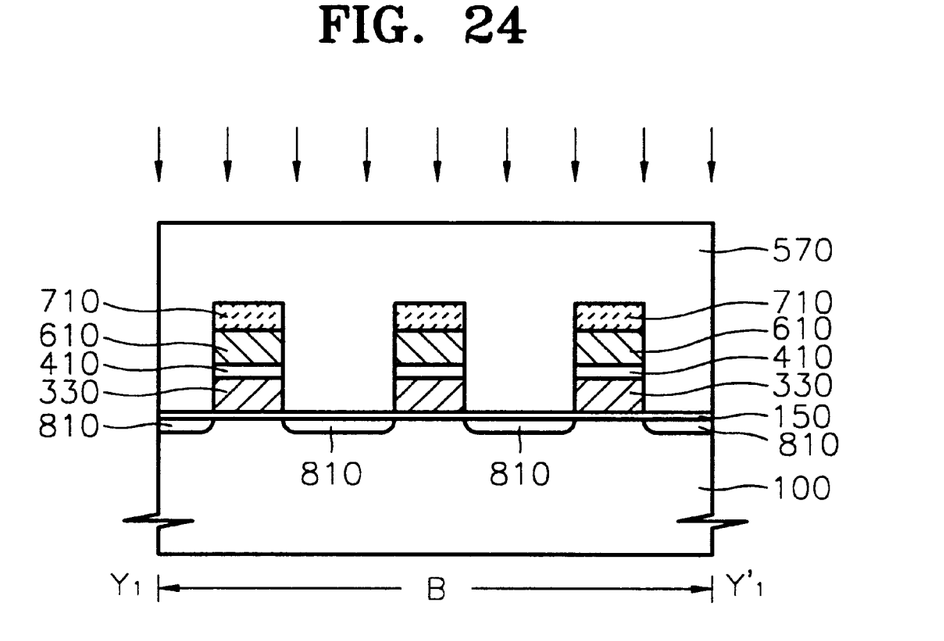
FIGS. 24 and 25 are schematic cross-sectional views illustrating formation of a gate in a peripheral circuit portion in a process for manufacturing a non-volatile memory device according to the present invention.
Figure 25:
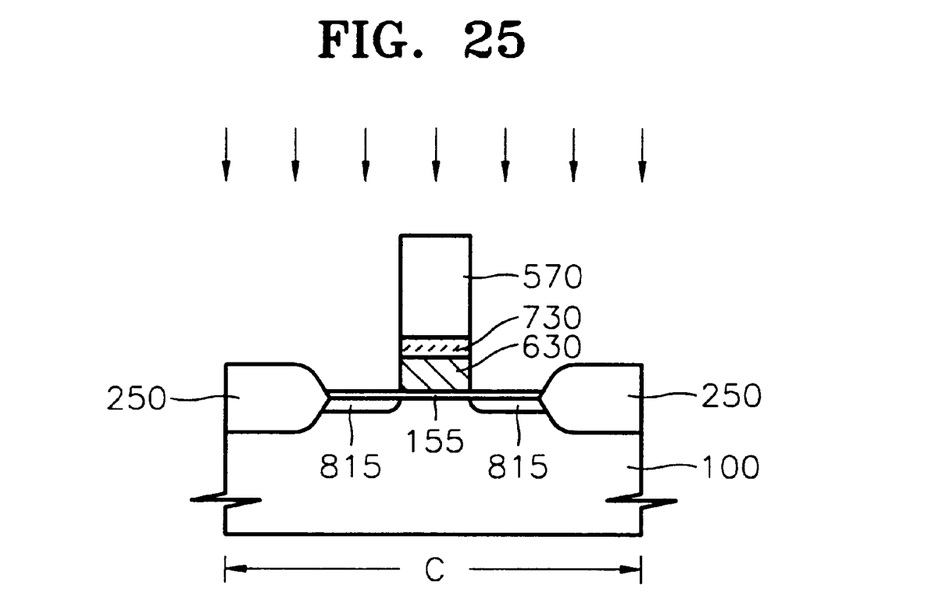

FIGS. 24 and 25 schematically illustrate formation of a gate 630 in the peripheral circuit portion (C).

As described above, the first impurity layer 810 is formed in the cell array unit (B). Next, a fourth photo resist pattern 570 covering the cell array unit (B) is formed as shown in FIG. 12. The photo resist pattern 570 exposes a part of the control gate layer 600 or the mask layer 700 in the peripheral circuit unit (C) as shown in FIG. 25.

The exposed mask layer 700 or exposed control gate layer 600 is etched using the fourth photo resist pattern 570 as an etch mask as shown in FIG. 25. Thus, a gate 630 exposing the semiconductor substrate 100 is formed in the peripheral circuit unit (C).

Second impurities are implanted by second ion-implantation into the exposed semiconductor substrate 100 using the fourth photo resist pattern as an ion implantation mask. Therefore, a second impurity layer 815 is formed in the peripheral circuit unit (C). The second impurity layer 815 is used as a low-concentration impurity layer having an LDD structure.

Here, phosphorous can be used as the second impurity which is implanted by second ion-implantation. In the second ion implantation step, for example, phosphorous can be ion-implanted at an energy of about 30 KeV to 70 KeV, preferably, at an energy of about 30 KeV to 45 KeV. Here, the dose of ion-implanted phosphorous can be maintained to approximately $5 \times 10^{12}$ to $5 \times 10^{13}$ dose number/$cm^2$, preferably, approximately $1 \times 10^{13}$ to $2 \times 10^{13}$ dose number/$cm^2$.

According to the embodiment of the present invention, the isolation layer 250 in the peripheral circuit unit (C) is protected from a patterning process for forming the control gate 610 or the like in the cell array unit (B) and also from a self alignment etching process following the process for forming the control gate 610. Thus, the isolation layer 250 in the peripheral circuit unit (C) can be maintained at a thickness greater than that of the isolation layer in the cell array unit (B), i.e., a thickness of approximately 3000 Å.

Accordingly, the second impurity layer 815 can be formed by ion-implanting phosphorous impurities capable of penetrating deeper than the arsenic impurity as described above. For example, also under the conditions of an energy of approximately 40 KeV and a dose of approximately $1 \times 10^{13}$ to $2 \times 10^{13}$ dose number/cm², the phosphorous ions can be prevented from penetrating into an area below the isolation layer 200.

Figure 26:
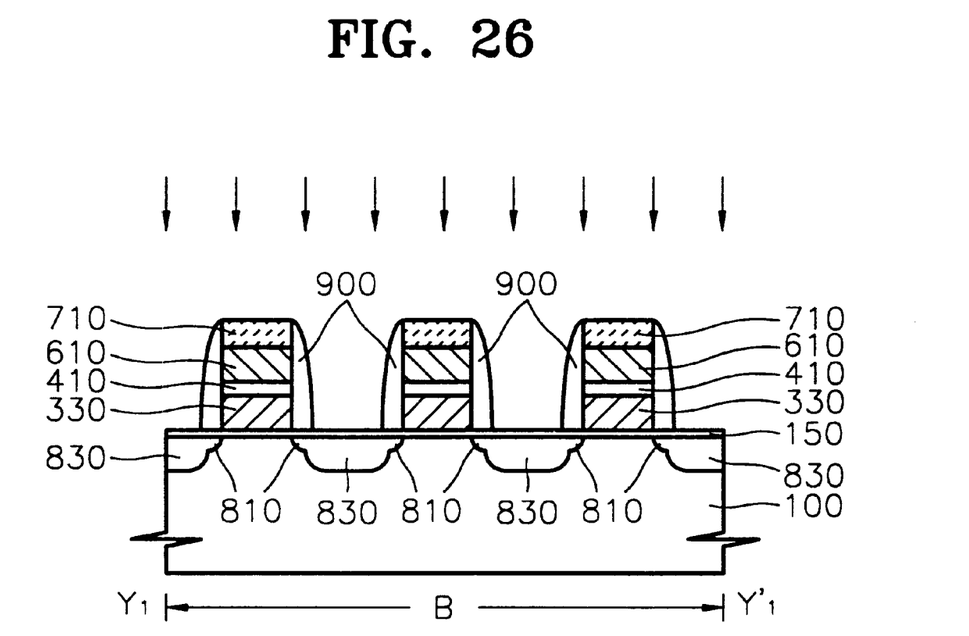
FIGS. 26 and 27 are schematic cross-sectional views illustrating formation of a third impurity layer on an exposed semiconductor substrate in a process for manufacturing a non-volatile memory device according to the present invention.
Figure 27:
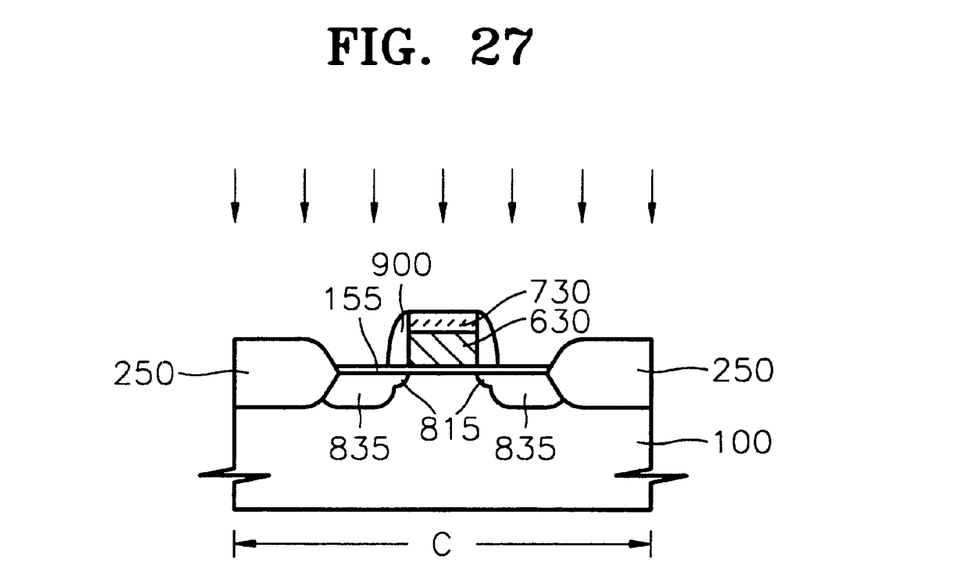

FIGS. 26 and 27 schematically illustrate the step of forming third impurity layers 830 and 835 on the exposed semiconductor substrate 100.

To be more specific, a spacer 900 covering the side wall of the control gate 610, the floating gate 330, or the first mask pattern 710 is formed. A spacer 900 covering the side wall of the gate 630 or the second mask pattern 730 is also formed at the same time. For example, the spacer 900 is formed by forming an oxide layer on the resultant surface on which the first or second impurity layer 810 or 850 has been formed, using chemical vapor deposition (CVD) and then etching the oxide layer.

Next, the third impurity layers 830 and 835 are formed by third ion-implantation of impurities into the exposed semiconductor substrate 100 using the spacer 900 as an ion implantation mask. Here, the first and second mask patterns 710 and 730 are also used as ion implantation masks. Each of the third impurity layers is used as a high-concentration impurity layer having an LDD structure. Arsenic or phosphorous can be used as the impurities.

However, impurities to be used must be able to provide a higher ion implantation margin in consideration of the thickness of the isolation layer in the cell array unit (B), i.e., about 1000 Å as described above. For example, the arsenic is ion-implanted under the conditions of an energy of approximately 30 KeV to 60 KeV, preferably, approximately 40 KeV, and a dose of approximately $5 \times 10^{14}$ to $5 \times 10^{16}$ dose number/cm², preferably, about $5 \times 10^{15}$ dose number/cm².

In this way, an LDD structure comprised of high-concentration and low-concentration impurity layers is formed. Thereafter, planarization, contact, or metal wiring is preformed.

What is claimed is:

1. A method of manufacturing a non-volatile memory device, comprising:

forming an isolation layer on a semiconductor substrate including a cell array part and a peripheral circuit part;

forming a floating gate pattern exposing the semiconductor substrate in the peripheral circuit part with a tunnel oxide layer interposed between the floating gate pattern and the semiconductor substrate in the cell array part, and an interlayer insulating layer covering the floating gate pattern;

forming a control gate layer which covers the interlayer insulating layer and the semiconductor substrate in the peripheral circuit part while interposing a gate oxide layer between the control gate layer and the semiconductor substrate;

protecting the peripheral circuit part by leaving a part of the control gate layer covering the peripheral circuit part, and forming a control gate, an interlayer insulating layer pattern, and a floating gate in the cell array part by sequentially patterning the control gate layer, the interlayer insulating layer, and the floating gate pattern in the cell array part;

forming a first low-concentration impurity layer by first ion-implantation of arsenic into the semiconductor substrate adjacent to the floating gate using the control gate and the control gate layer covering the peripheral circuit part as an ion-implantation mask;

forming a gate in the peripheral circuit part by patterning the control gate layer in the peripheral circuit part with a photo resist pattern shielding the cell array part;

forming a second low-concentration impurity layer by second ion-implantation of phosphorous into the semiconductor substrate adjacent to the gate using the photo resist pattern as an ion-implantation mask;

forming a spacer exposing the semiconductor substrate by covering the side walls of the floating gate and the control gate in the cell array part and covering the sidewall of the gate in the peripheral circuit part; and forming a third high-concentration impurity layer overlapping the first and second impurity layers by third ion-implantation of arsenic into the exposed semiconductor substrate using the spacer as an ion-implantation mask.

2. The method of manufacturing a non-volatile memory device as claimed in claim 1, further comprising forming a mask layer on the control gate layer after forming the control gate layer.

3. The method of manufacturing a non-volatile memory device as claimed in claim 2, wherein the mask layer is used as an ion-implantation mask in the first ion-implantation of arsenic or the third ion-implantation of arsenic.

4. The method of manufacturing a non-volatile memory device as claimed in claim 1, wherein the arsenic is ion-implanted at an energy of about 30 KeV to 60 KeV in the first ion-implantation.

5. The method of manufacturing a non-volatile memory device as claimed in claim 4, wherein the arsenic is ion-implanted at an energy of about 30 KeV to 45 KeV in the first ion-implantation.

6. The method of manufacturing a non-volatile memory device as claimed in claim 4, wherein the arsenic is ion-implanted at an energy of about 30 KeV to 45 Kev the third ion-implantation.

7. The method of manufacturing a non-volatile memory device as claimed in claim 1, wherein the phosphorous is ion-implanted at an energy of about 30 KeV to 70 KeV in the second ion-implantation.

8. The method of manufacturing a non-volatile memory device as claimed in claim 7, wherein the phosphorous is ion-implanted at an energy of about 30 KeV to 45 KeV in the second ion-implantation.

9. The method of manufacturing a non-volatile memory device as claimed in claim 1, wherein the first or second impurity layer has a concentration of approximately $5 \times 10^{12}$ to $5 \times 10^{13}$ dose number/cm².

10. The method of manufacturing a non-volatile memory device as claimed in claim 9, wherein the first or second impurity layer has a concentration of approximately $1 \times 10^{13}$ to $2 \times 10^{13}$ dose number/cm².

11. The method of manufacturing a non-volatile memory device as claimed in claim 10, wherein the arsenic is ion-implanted at an energy of about 30 KeV to 60 KeV in the third ion-implantation.

* * * * *